United States Patent [19]

Reddick

[11] Patent Number: 5,179,334
[45] Date of Patent: Jan. 12, 1993

[54] POWER PASSING INDUCTOR CAPABLE OF OPERATION AT FREQUENCIES HIGHER THAN 900 MHZ

[75] Inventor: Donald W. Reddick, Thornton, Colo.
[73] Assignee: Regal Technologies Ltd., Englewood, Colo.
[21] Appl. No.: 780,734
[22] Filed: Oct. 18, 1991
[51] Int. Cl.⁵ .............................................. H03H 7/09
[52] U.S. Cl. .................... 323/355; 333/181; 333/185; 333/245
[58] Field of Search ............... 323/355; 336/220, 221; 333/110, 112, 132, 172, 175, 181, 185, 245

[56] References Cited

U.S. PATENT DOCUMENTS

| | | | |
|---|---|---|---|
| 3,590,329 | 6/1971 | Krepps | 336/183 |
| 3,673,517 | 6/1992 | Ticknor. | |
| 3,980,975 | 9/1976 | Maxon et al. | |
| 3,982,814 | 9/1976 | Kaiserwerth et al. | 336/180 |
| 4,394,631 | 7/1983 | Pavlic | 333/132 |
| 4,641,115 | 2/1987 | Bailey | 333/181 |
| 4,682,125 | 7/1987 | Harrison et al. | 333/12 |
| 5,032,808 | 7/1991 | Reddy | 333/181 |

Primary Examiner—William H. Beha, Jr.
Attorney, Agent, or Firm—Allegretti & Witcoff, Ltd.

[57] ABSTRACT

The invention is comprised of two inductors wound in series but in opposite directions around a ferrite core, a resistor being connected in parallel with one inductor, and a wire being looped through a ferrite bead and being wound around the other inductor. The invention allows a 60 Hz power signal to pass without excessively interfering with radio frequency signals in excess of 900 MHz and preferably on the order of 1 GHz. The invention is particularly useful in cable television systems, where a power signal and an RF signal are simultaneously transmitted.

8 Claims, 3 Drawing Sheets

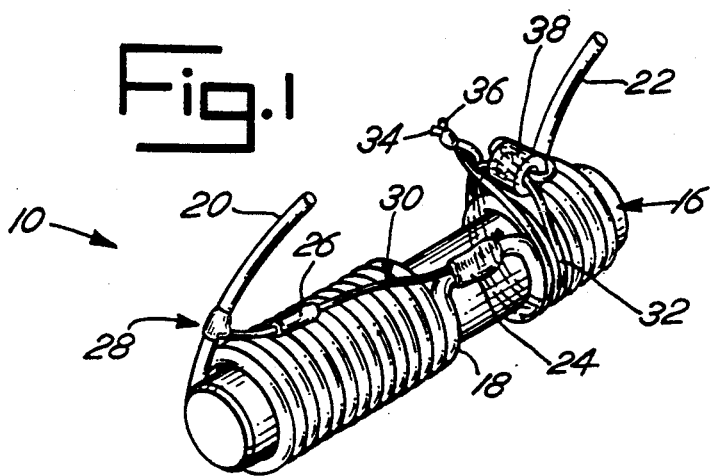
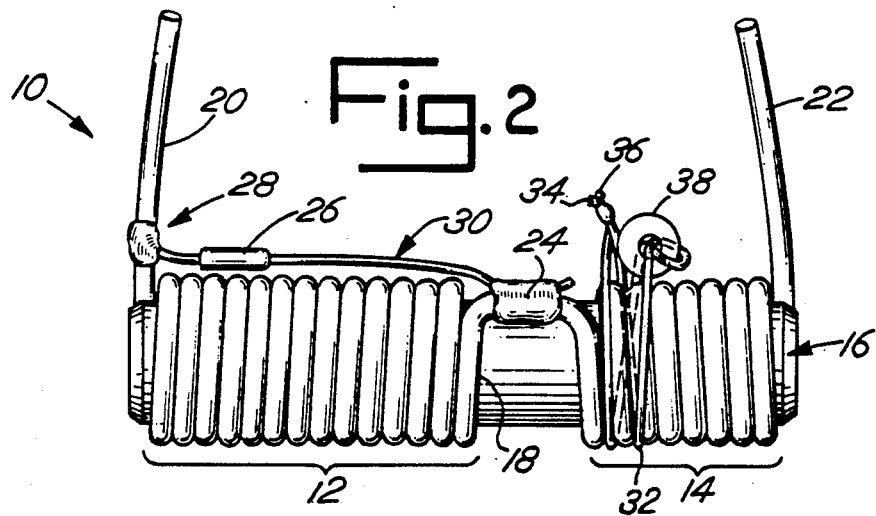
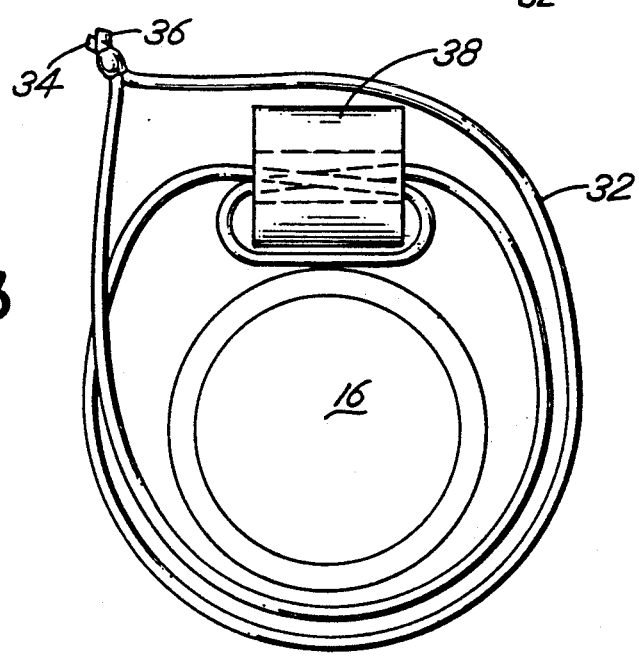

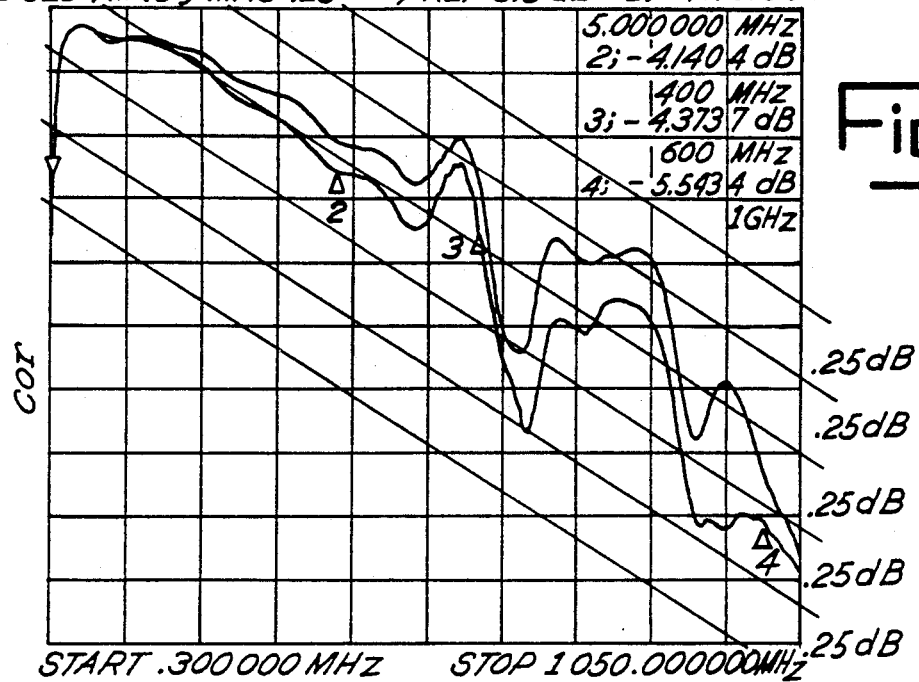
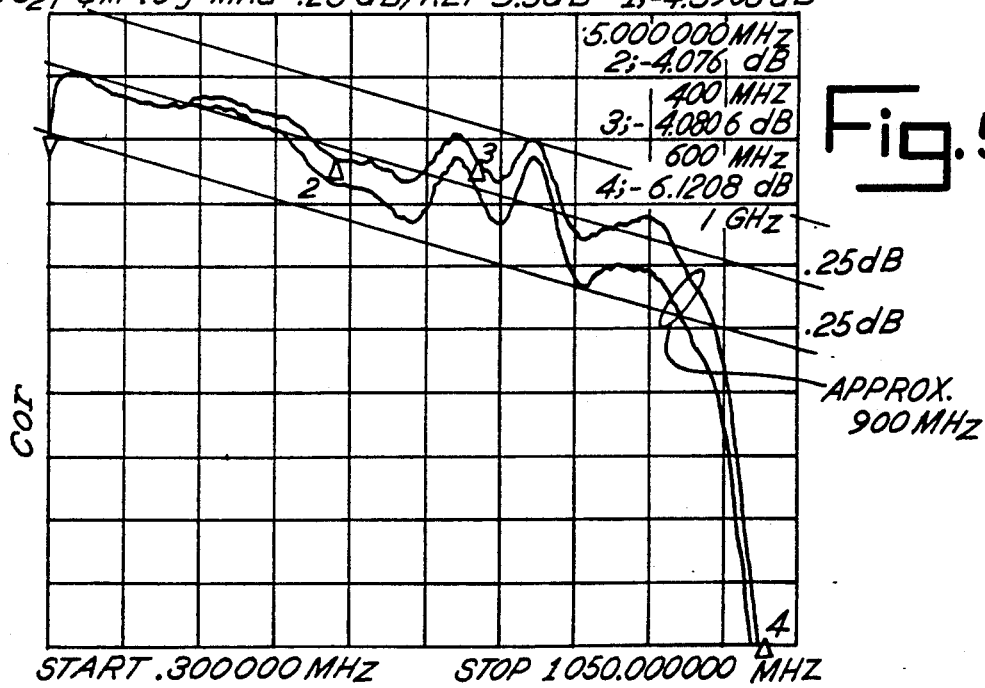

5,179,334

POWER PASSING INDUCTOR CAPABLE OF OPERATION AT FREQUENCIES HIGHER THAN 900 MHZ

BACKGROUND OF THE INVENTION

The present invention relates to communication equipment. More particularly, the present invention relates to a power passing inductor which is capable of passing a power signal without resulting in excessive loss or distortion of Radio Frequency (RF) signals above 900 MHz.

A fundamental goal of a cable television system is to deliver the best possible picture quality to its subscribers. To achieve this end, it is necessary to maintain a flat signal response of an appropriate power level. In most cable television systems, at least two signals are simultaneously transmitted through the same wire: a power signal at the frequency of 60 Hz, and data or RF signals commonly in the frequency range of 5 to 500 MHz. The recent industry trend has been to extend the range of RF signals up to and above 900 MHz. Absent appropriate internal circuitry, the 60 Hz power signal can interfere with the RF signals, thereby distorting picture quality.

When an electric component is inserted into a cable television system, the component will likely have some effect on the RF signals that are transmitted through the system. Often, the component will cause some loss or distortion of the RF signals. This effect is generally depicted by an "insertion loss trace," a graph of decibels (dB) versus frequency. On such a graph, a large swing in decibels indicates a large effect on the RF signal. Ideally, the insertion loss trace of any cable television component should fit into a 0.5 dB to 1 dB range. In order to maintain this flat signal response and corresponding good television reception, it is known that an inductor can be used to pass only the power signal while providing a theoretically high impedance to the RF signals. Existing power passing inductors, however, only work well up to about 900 MHz. Above 900 MHz, the interwinding capacitance of the inductors causes very wavy and unpredictable component signal responses.

The existing art discloses devices that operate satisfactorily with RF signals ranging from 5 to 900 MHz. For instance, U.S. Pat. Nos. 4,394,631 and 3,982,814 each operate only up to about 400 MHz. Another style device, which is unpatented but widely used, performs acceptably up to about 600 MHz. Above 600 MHz, its frequency response becomes wavy and unpredictable. U.S. Pat. No. 4,641,115 operates only up to about 900 MHz. After 900 MHz, a steep roll-off is seen in its insertion loss trace. Further, all of the above existing art differs in construction from the present invention, as is also true of U.S. Pat. Nos. 4,682,125; 3,980,975; 3,673,517; and 3,590,329.

As noted above, the recent industry trend has been to extend the upper frequency limit of cable television systems. In particular, the challenge has been to extend the operating frequency of cable television systems to above 900 MHz. Accordingly, a primary object of the invention is to provide a power passing inductor that is capable of passing the 60 Hz power signal without excessively interfering with RF circuitry operating at above 900 MHz, and preferably at frequencies on the order of 1 GHz.

Further objects and advantages of the present invention will become apparent in the following description.

SUMMARY OF THE INVENTION

The present invention provides a device useful for passing a 60 Hz power signal without excessively interfering with RF signals above 900 MHz and preferably on the order of 1 GHz. Two inductors are wound in series but in opposite directions around a ferrite rod. In one embodiment of the invention, one inductor comprises 14 turns, and the other inductor comprises 7 turns. A high impedance resistor on the order of 2000 ohms is connected in parallel across the one inductor. A #22 gauge wire is looped through a small ferrite bead and wound between the fifth and sixth turns and the sixth and seventh turns of the other inductor. The ends of this wire are twisted and soldered together behind the ferrite bead. The combination of the high impedance resistor and the ferrite bead eliminates the undesired resonances in the RF signals that would otherwise be caused by the power passing device at the above-mentioned high frequencies.

DETAILED DESCRIPTION OF THE DRAWINGS

There is shown in the attached drawings a presently preferred embodiment of the present invention, wherein like numerals in the various views refer to like elements and wherein:

FIG. 1 is a perspective view of a power passing inductor made in accordance with the present invention;

FIG. 2 is a side elevation view of the power passing inductor;

FIG. 3 is an end view of a wire and ferrite bead wound around a core;

FIG. 4 is a graph of the insertion loss associated with known prior art power passing inductors, illustrating unpredictable frequency response at above 600 MHz;

FIG. 5 is a graph of the insertion loss associated with known prior art power passing inductors, illustrating unacceptably steep signal roll off at above 900 MHz.

DETAILED DESCRIPTION OF THE PREFERRED EMBODIMENT

Figure 6:
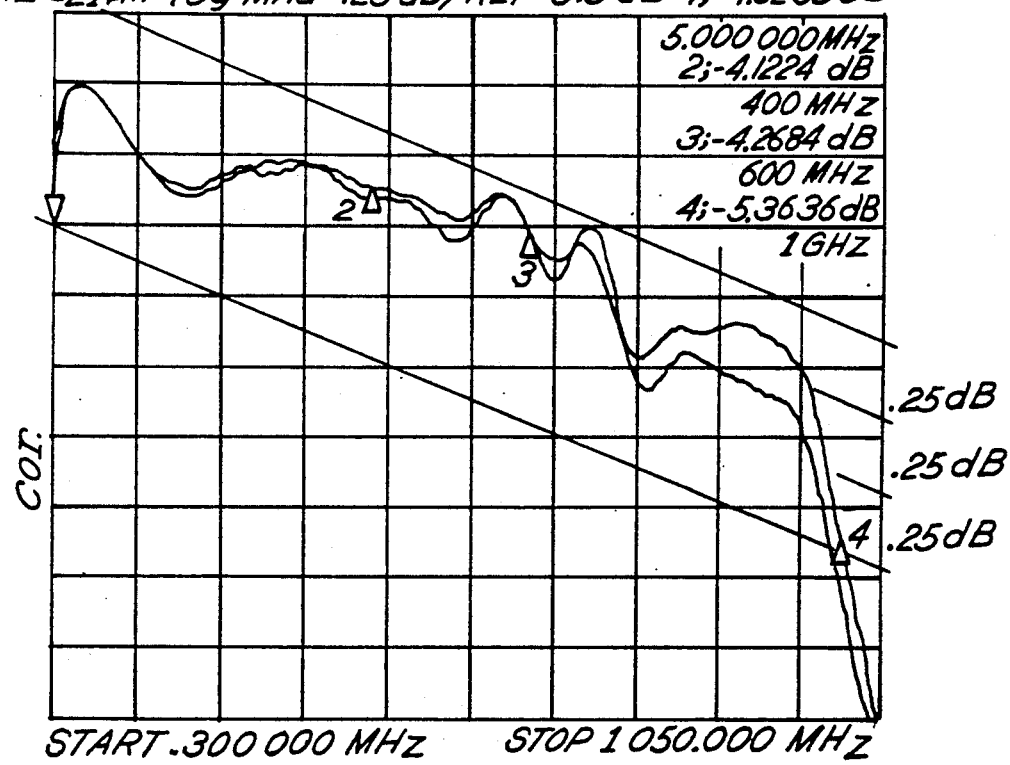
FIG. 6 is a graph of the insertion loss associated with the present invention, illustrating the desired signal response.

FIG. 1 shows a perspective view of a power passing device 10 made in accordance with the present invention. Device 10 comprises a first inductor 12 and a second inductor 14, each wound around a ferrite core 16. In the preferred embodiment, the ferrite core is cylindrical, in order to facilitate the winding of wire thereon.

Inductors 12 and 14 are formed of one continuous wire 18 having a first lead 20 and a second lead 22. In the preferred embodiment, the first inductor 12 is comprised of fourteen turns of wire 18 wound in one direction. At an intermediate position 24 on the ferrite core, the wire 18 is then bent and wound in a reverse direction to form the second inductor 14. The second inductor 14 is comprised of seven turns which are thus would in the opposite direction of the windings of the first inductor 12. It has been determined through experimentation that the number of turns comprising the first inductor can range from fourteen to twenty, while still rendering acceptable performance of the device 10.

A high impedance resistor 26 has a first lead 28 and a second lead 30. The first lead 28 is connected to the first lead 20 of the power passing device 10. The second lead 30 is connected at the intermediate position 24 between the first inductor 12 and the second inductor 14. In one presently preferred embodiment, resistor 26 is 2000 ohms, though a resistor in the range of 1500-2500 ohms would be acceptable.

FIG. 3 shows a #22 gauge wire 32 having a first end 34 and a second end 36, being looped twice through a ferrite bead 38 and wound around the ferrite core 16. As illustrated in FIG. 2, the first end 34 of the wire 32 is wound around the second inductor 14 between the fifth and sixth turns. The second end 36 of the wire 32 is wound around the second inductor 14 between the sixth and seventh turns. The two ends of the wire are then brought up behind the ferrite bead 38 and twisted and soldered together. The combined presence of wire 32 and ferrite bead 16, together with the high impedance resistor 26, has been shown through experimentation to eliminate the undesired resonances that would otherwise be caused in RF signals on the order of 900 MHz to 1 GHz. Moreover, the ferrite bead and wire structure shown in FIG. 3 has an additional benefit. In the prior art, the undesired resonances in RF signals become greater as the thickness of the wire 18 used to wind the inductors increases. The presence of the ferrite bead and wire structure in the present invention, however, appears to make the gauge of the wire 18 relatively immaterial. For instance, experiments show that no significant improvement occurs when #18 gauge wire is used rather than #17 gauge wire. It is believed that the present invention will perform well with wire 18 of different sizes, e.g., those in the range of #16 to #19 gauge.

FIGS. 4 and 5 illustrate the insertion loss characteristics of existing prior art power passing devices and will be discussed in the following paragraphs. These graphs depict the RF signal loss and distortion caused by the presence of the given device and illustrate that the prior art is incompatible with cable television systems operating at frequencies on the order of 900 MHz to 1 GHz.

FIG. 4 is the insertion loss trace of a widely used power passing device. This device consists of four inductors wound on a circular rod of ferrite material. The first two inductors are connected in series and wound in the same direction. The second two inductors are connected in series but wound in the opposite direction of the first two inductors. A 2000 ohm resistor is connected in parallel across each inductor. As shown in FIG. 4, this style power passing device results in a wavy and unpredictable frequency response above 600 MHz.

FIG. 5 is the insertion loss trace of the power passing device manufactured by Texscan and disclosed by U.S. Pat. No. 4,641,115. This device incorporates a secondary winding having a resistor connected in parallel with it, in order to reduce inductor resonances. As shown in FIG. 5, this style power passing device only operates satisfactorily up to about 900 MHz. Above 900 MHz, the insertion loss rolls off too steeply to be compensated for in the cable television system.

FIG. 6 illustrates the insertion loss attainable with a device made according to the present invention, overcoming the deficiencies of the prior art. The slope of the insertion loss curve is acceptable up to 1 GHz. A cable television system using the present invention would thus be capable of transmitting a 60 Hz power signal without interfering with RF signals simultaneously transmitted at frequencies up to 1 GHz. Moreover, it has been shown through experimentation that this device is repeatable and its insertion loss trace predictable.

While a preferred embodiment of the present invention has been depicted and described, it will be appreciated by those skilled in the art that many modifications, substitutions and changes may be made thereto without departing from the true spirit and scope of the invention.

What is claimed is:

1. A power passing device for passing a power signal without resulting in excessive loss or distortion of simultaneously transmitted radio frequency signals above 900 MHz and on the order of 1 GHz, comprising:
   (a) a core of ferrite material;
   (b) a first inductor wound around said core;
   (c) a second inductor wound around said core in series with said first inductor but in the opposite direction of said first inductor;
   (d) a resistor connected in parallel with said first inductor;
   (e) a ferrite bead for reducing unwanted resonances;
   (f) a wire having a first end and a second end, said wire being looped through said ferrite bead and being wound around said second inductor.

2. A device as in claim 1 wherein said first inductor comprises 14 turns of wire and said second inductor comprises 7 turns of wire.

3. A device as in claim 2 wherein the first end of said wire is wound between the fifth and sixth turns of said second inductor, and wherein the second end of said wire is wound between the sixth and seventh turns of said second inductor, the two ends being joined together.

4. A device as in claim 1 wherein said wire is #22 gauge.

5. A device as in claim 1 wherein said resistor is 2000 ohms.

6. A device as in claim 1 wherein said wire is looped twice through said ferrite bead.

7. A device as in claim 1 wherein said first and second inductors are comprised of wire of a gauge ranging from #16 to #19.

8. A device as in claim 1 wherein the core is cylindrical.

* * * * *